United States Patent
Tran et al.

(10) Patent No.: US 6,910,908 B2
(45) Date of Patent: *Jun. 28, 2005

(54) REINFORCED SOCKET COVER ASSEMBLY

(75) Inventors: MaiLoan T. Tran, Harrisburg, PA (US); Andrew D. Balthaser, Dauphin, PA (US)

(73) Assignee: Tyco Electronics Corporation, Middletown, PA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/284,920

(22) Filed: Oct. 31, 2002

(65) Prior Publication Data

US 2004/0087199 A1 May 6, 2004

(51) Int. Cl.$^7$ ............................................. H01R 13/625
(52) U.S. Cl. ................................................... 439/342
(58) Field of Search .............................. 439/342, 259, 439/265, 266, 263, 268

(56) References Cited

U.S. PATENT DOCUMENTS

| | | | |
|---|---|---|---|
| 6,254,415 B1 * | 7/2001 | Mizumura et al. .......... | 439/342 |
| 6,280,224 B1 | 8/2001 | Huang ......................... | 439/342 |
| 6,338,639 B1 * | 1/2002 | Trout et al. ................. | 439/342 |
| 6,338,640 B1 * | 1/2002 | Lin ............................. | 439/342 |
| 6,450,825 B1 * | 9/2002 | Huang ......................... | 439/342 |
| 6,619,974 B1 * | 9/2003 | Hou et al. ................... | 439/342 |
| 6,692,281 B1 * | 2/2004 | McClinton et al. ......... | 439/342 |

* cited by examiner

Primary Examiner—Tho D. Ta

(57) ABSTRACT

A socket assembly is provided having a socket cover slidably mounted to a socket base. The socket cover includes a cam retention area containing a drive plate and a cam lever rotatably engaging the socket cover, socket base and drive plate. The cam rotatably engages, and applies torque forces to, the socket cover, plate, and socket base to slide the socket cover with respect to the socket base. The drive plate and the cam retention area include torque transfer members that engage one another. The torque transfer members are located at intermediate points with the drive plate and the cam retention area.

20 Claims, 4 Drawing Sheets

REINFORCED SOCKET COVER ASSEMBLY

BACKGROUND OF THE INVENTION

The present invention generally relates to a socket cover that is cam actuated. More particularly, the present invention relates to a socket cover having a cover plate configured to absorb torque induced by cam rotation.

Many large electronic devices, such as computers, use sockets to connect different electronic components. For example, pin grid array (PGA) sockets are used to connect electronic packages, such as processors, to printed circuit boards. PGA sockets facilitate electrical communication between a large number of pins on the processor and contacts on the circuit board. PGA sockets may utilize a plastic socket cover that is slidably movable on a plastic socket base between open and closed positions. Generally, a cam mechanism is used to drive the cover and base between open and closed positions.

The socket cover has an array of pin holes configured to match an array of pins on the processor. Similarly, the socket base has an array of pin receiving chambers configured to accept the array of pins on the processor and connected to contact pads on the circuit board. The processor is mated to the socket by first placing the processor such that its pins slide into the pin holes of the socket cover. With the socket cover in the open position, the processor pins pass through the pin holes of the socket cover into the pin receiving chambers of the socket base, but are not yet electrically connected to the pin receiving chambers of the socket base. A cam mechanism on the socket is rotated to slide the socket cover to the closed position which causes the processor pins to electrically connect to contacts in the pin receiving chambers in the socket base.

The cam mechanism includes a plate that is retained in a recessed area on the bottom of the socket cover between the socket cover and the socket base. The socket cover, plate, and socket base each have apertures therethrough that align with one another to receive a cam shaft. The cam shaft is situated in a channel on the socket cover and extends through the socket cover, plate and socket base. The cam shaft is rotated to slide the socket cover to the closed position on the socket base to electrically connect the processor pins to contacts in the pin receiving chambers in the socket base. More specifically, as the cam shaft is rotated to cause the sliding movement between the socket cover and socket base, the cam shaft drives the plate relative to the socket base. The plate is held firmly in the recessed area in the socket cover which in turn causes the socket cover to move relative to the socket base. The plate is used to absorb the torque forces created by the cam shaft to prevent the socket cover from cracking.

However, the conventional sockets suffer from several drawbacks. As the cam shaft rotates, it generates torque forces. As noted above, the plate is positioned in the recessed area of the socket cover to absorb much of the torque forces and distribute the torque forces throughout the plate in order to prevent the torque forces from cracking the thin plastic socket cover. However, the torque forces cause the plate to twist or "rotate" within the recessed area such that certain angled points on the plate press directly against the wall segments of the socket cover. Thus, the torque forces are redistributed at high stress concentrations at certain points along the wall segments which cause strains and cracks in the socket cover to develop over time with repeated use. Once cracks occur in the socket cover, the plate moves relative to the socket cover thereby reducing the amount of motion transferred from the cam to the socket cover. Hence, the cam shaft cannot properly engage the socket cover to slidably move the socket cover the full desired distance relative to the socket base.

A need exists for a socket cover that addresses the above noted problems and others experienced heretofore.

BRIEF SUMMARY OF THE INVENTION

Certain embodiments of the present invention include an electrical socket assembly having a socket cover slidably mounted to a socket base. The socket cover includes a cam retention area containing a drive plate and a cam shaft rotatably engaging the socket cover, socket base and drive plate. The cam shaft rotatably engages, and applies torque forces to, the socket cover and socket base to slide the socket cover with respect to the socket base. The drive plate and the cam retention area include torque transfer members that engage one another. The torque transfer members are located at intermediate points with the drive plate and the cam retention area.

Figure 1:
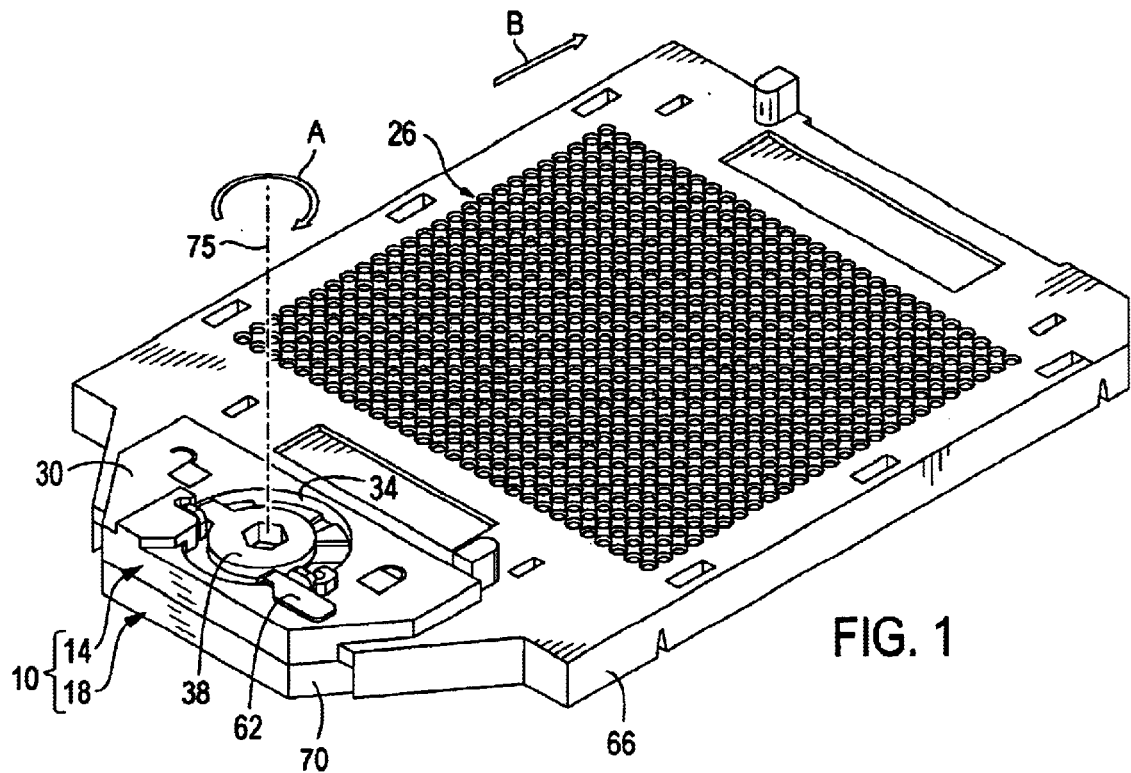
FIG. 1 illustrates a top isometric view of a socket assembly formed according to an embodiment of the present invention.

The foregoing summary, as well as the following detailed description of certain embodiments of the present invention, will be better understood when read in conjunction with the appended drawings. For the purpose of illustrating the invention, there is shown in the drawings, certain embodiments. It should be understood, however, that the present invention is not limited to the arrangements and instrumentality shown in the attached drawings.

DETAILED DESCRIPTION OF THE INVENTION

Figure 2:
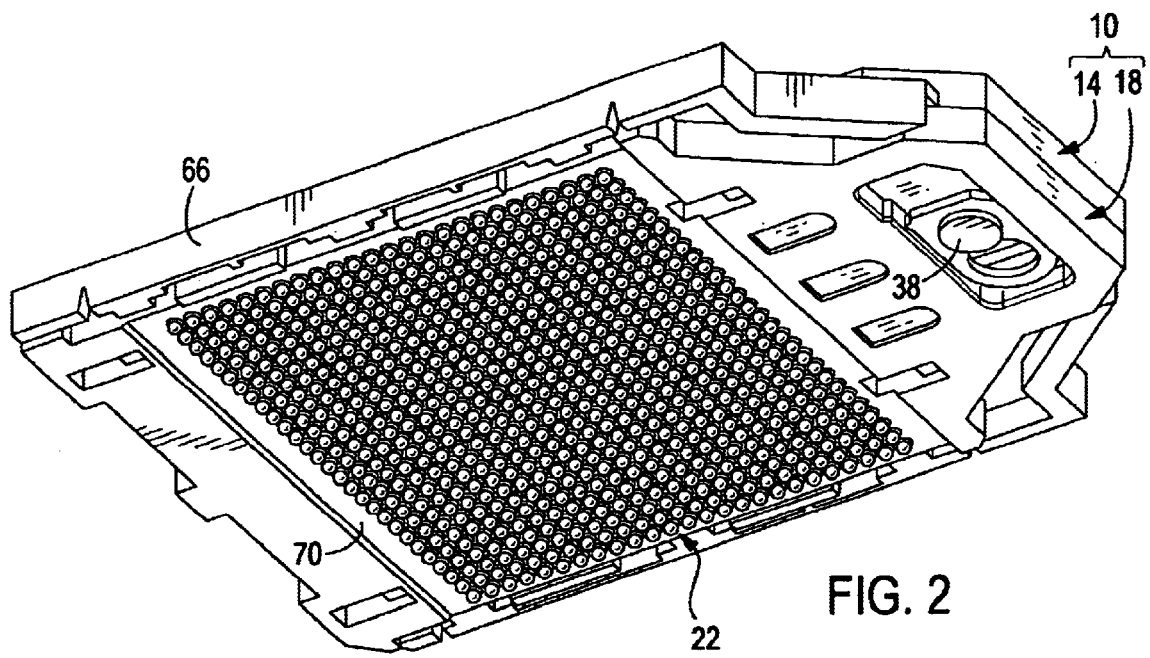
FIG. 2 illustrates a bottom isometric view of a socket assembly formed according to an embodiment of the present invention.

FIGS. 1 and 2 illustrate isometric views of a socket assembly 10 formed according to an embodiment of the present invention. The socket assembly 10 includes an insulated socket cover 14 slidably mounted to an insulated socket base 18. The socket base 18 has a body 70 that carries an array of receptacle contacts 22 (FIG. 2) extending therethrough. The socket cover 14 has an array of pin holes 26 (FIG. 1) that are aligned to be positioned above the array of receptacle contacts 22. In operation, the socket assembly 10 is connected to an electronic component such as a circuit board (not shown) such as by soldering the receptacle contacts 22 to contact pads or traces on the circuit board. A processor (not shown) having an array of pins is then positioned on top of the socket cover 14 such that the pin holes 26 receive the pins. The pins of the processor extend into and engage the receptacle contacts 22 in the body 70 of the socket base 18.

The socket cover 14 has a generally rectangular body 66 with a cam portion 30 extending from an end thereof. The cam portion 30 has a semicircular channel 34 notched in the socket cover 14 to receive a lever 62 and a cylindrical cam shaft 38. The cam shaft 38 extends through the body 66 of the socket cover 14 and the body 70 of the socket base 18. The cam shaft 38 may be formed of metal or another suitably hard material.

The socket assembly 10 as shown in FIG. 1 is in an unlocked position where the socket cover 14 and socket base 18 are aligned such that the pins of the processor are not bound in the pin holes 26 of the socket cover 14. As the cam shaft 38 is rotated in the direction of arrow A (FIG. 1) about a rotational axis 75, the cam shaft 38 indirectly engages the body 66 of the socket cover 14 and directly engages the body 70 of the socket base 18. The cam shaft 38 pushes the body 66 of the socket cover 14 in the direction of arrow B with respect to the body 70 of the socket base 18 to cause a relative horizontal shift. As the socket cover 14 and the socket base 18 move, they cause the pin holes 26 to shift out of alignment with the receptacle contacts 22 and bind the processor pins within the socket cover 14.

Figure 3:
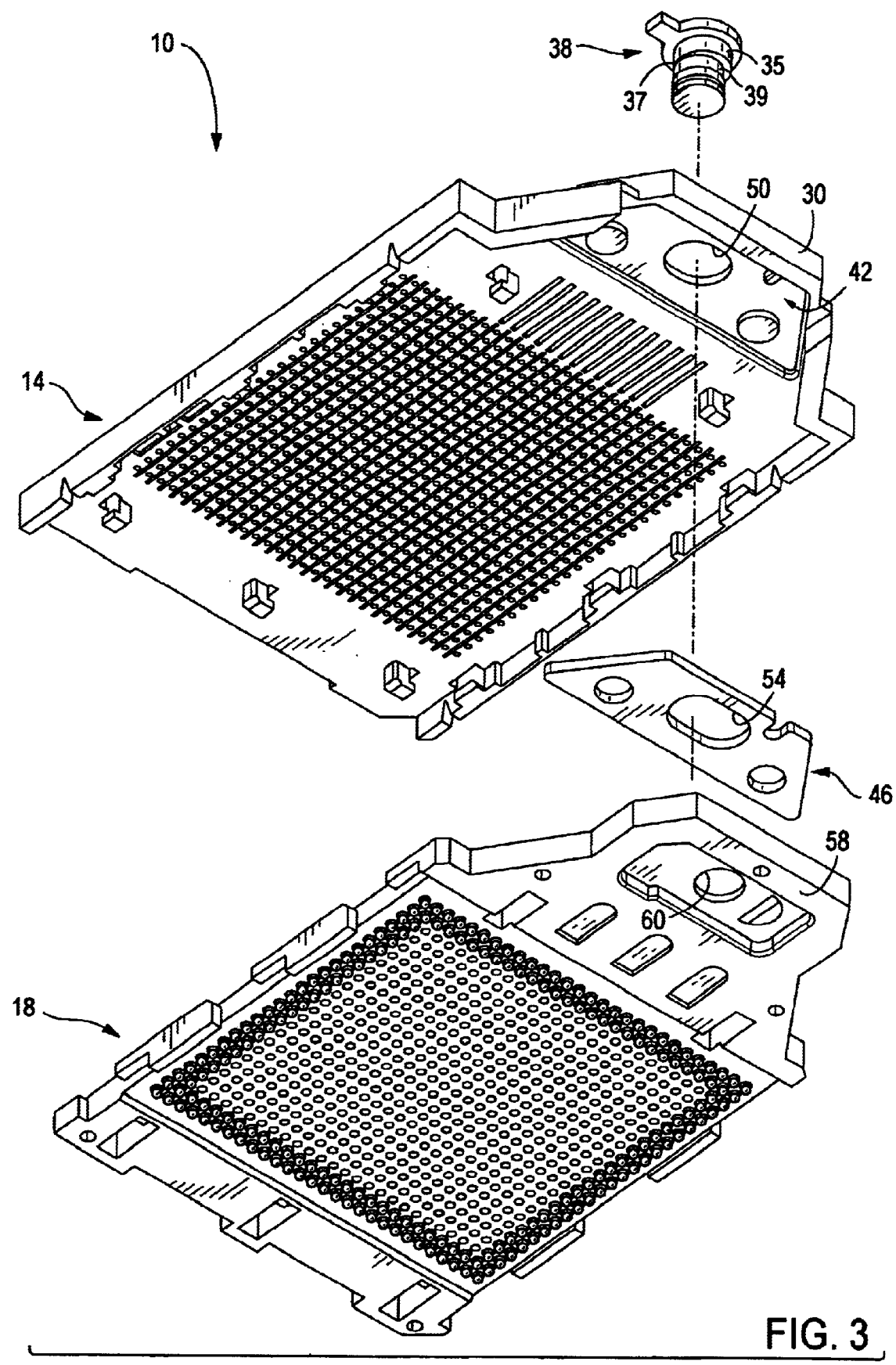
FIG. 3 illustrates an exploded isometric view of the socket assembly of FIG. 1.

FIG. 3 illustrates an exploded isometric view of the socket assembly 10. On the bottom side of the socket cover 14, the cam portion 30 includes a recessed area 42 having a trapezoidal shape that receives a trapezoidal shaped drive plate 46. The drive plate 46 may be formed of metal or another suitably hard material. The cam portion 30 has a circular cam aperture 50 and the drive plate 46 has an oval cam aperture 54. The socket base 18 also has a cam portion 58 that presses up flush against the drive plate 46 when the socket assembly 10 is fully assembled. The cam portion 58 of the socket base 18 also has a circular cam aperture 60. When the socket assembly 10 is fully assembled, the cam apertures 50, 54 and 60 of the socket cover 14, drive plate 46, and socket base 18, respectively, are all aligned and receive the cam shaft 38.

The cam shaft 38 includes cylindrical upper and lower portions 35 and 39. The upper portion 35 has a larger radius than the lower portion 39. The upper portion 35 overlaps the lower portion 39 along the perimeter of the lower portion 39 except where the upper and lower portion 35 and 39 share a common wall 37 at a point in their respective perimeters. The upper portion 35 is received within the cam apertures 50 and 54 and the lower portion 39 is received within the cam aperture 60. As the cam shaft 38 is rotated about the rotational axis 75 (FIG. 1) in the direction of arrow A (FIG. 1), the larger-radiused upper portion 35 engages the drive plate 46 and moves the drive plate 46, and thus the socket cover 14, in the direction of arrow B (FIG. 1) relative to the socket base 18 as the lower portion 39 rotates within the cam aperture 60.

Figure 4:
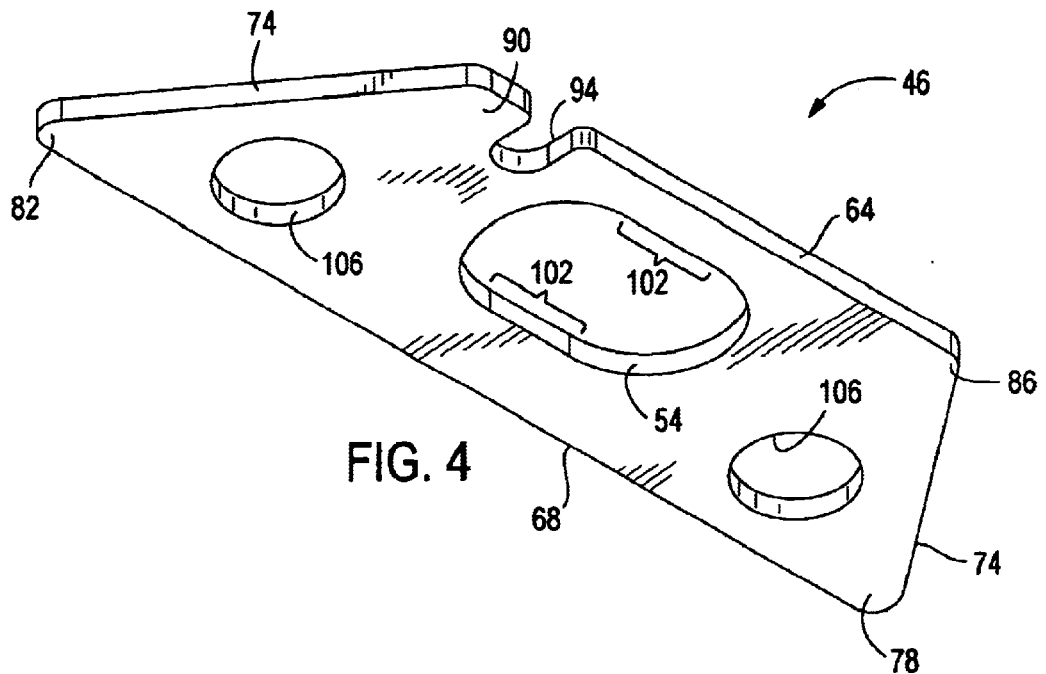
FIG. 4 illustrates an isometric view of a drive plate formed according to an embodiment of the present invention.

FIG. 4 illustrates an isometric view of the drive plate 46. The drive plate 46 is rhomboid or trapezoidal in shape and is defined by an outer wall 64, an inner wall 68 and opposed side walls 74. The side walls 74 form acute angles with the inner wall 68 at first and second inner corners 78 and 82, respectively, and obtuse angles with the outer wall 64 at first and second outer corners 86 and 90. Optionally, the drive plate 46 may be shaped differently, such as circular, rectangular, star-shaped, triangular, hexagonal, rhomboid, pentagonal and the like. A U-shaped notch 94 is cut into the drive plate 46 along the outer wall 64 to receive a keying feature 98 (FIG. 5) in the recessed area 42 (FIG. 3). The oval shaped cam aperture 54 is formed near the center of the drive plate 46 and has parallel opposed segments 102 defining the narrowest portion of the cam aperture 54. The segments 102 engage the upper portion 35 (FIG. 3) of the cam shaft 38 (FIG. 3). The drive plate 46 also includes circular post holes 106 situated on opposite sides of the cam aperture 54.

Figure 5:
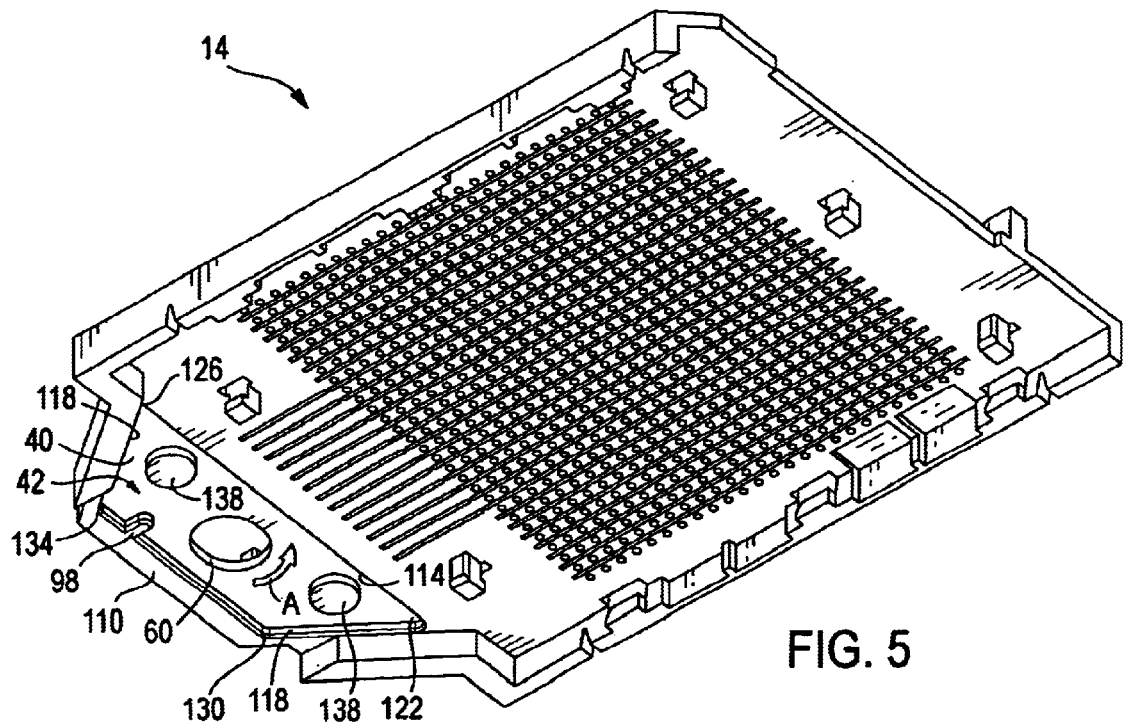
FIG. 5 illustrates a bottom isometric view of a socket cover formed according to an embodiment of the present invention.

FIG. 5 illustrates a bottom isometric view of the socket cover 14. The recessed area 42 is bordered by an outer wall 110, an inner wall 114, and opposed side walls 118. The side walls 118 intersect the inner wall 114 at first and second inner corners 122 and 126, respectively, and intersect the outer wall 110 at first and second outer corners 130 and 134, respectively. Cylindrical support posts 138 are formed with, and extend from, a recessed surface 40 of the recessed area 42. The support posts 138 are located on opposite sides of the cam aperture 50. A keying feature 98 extends from the outer wall 110 into the recessed area 42.

Figure 6:
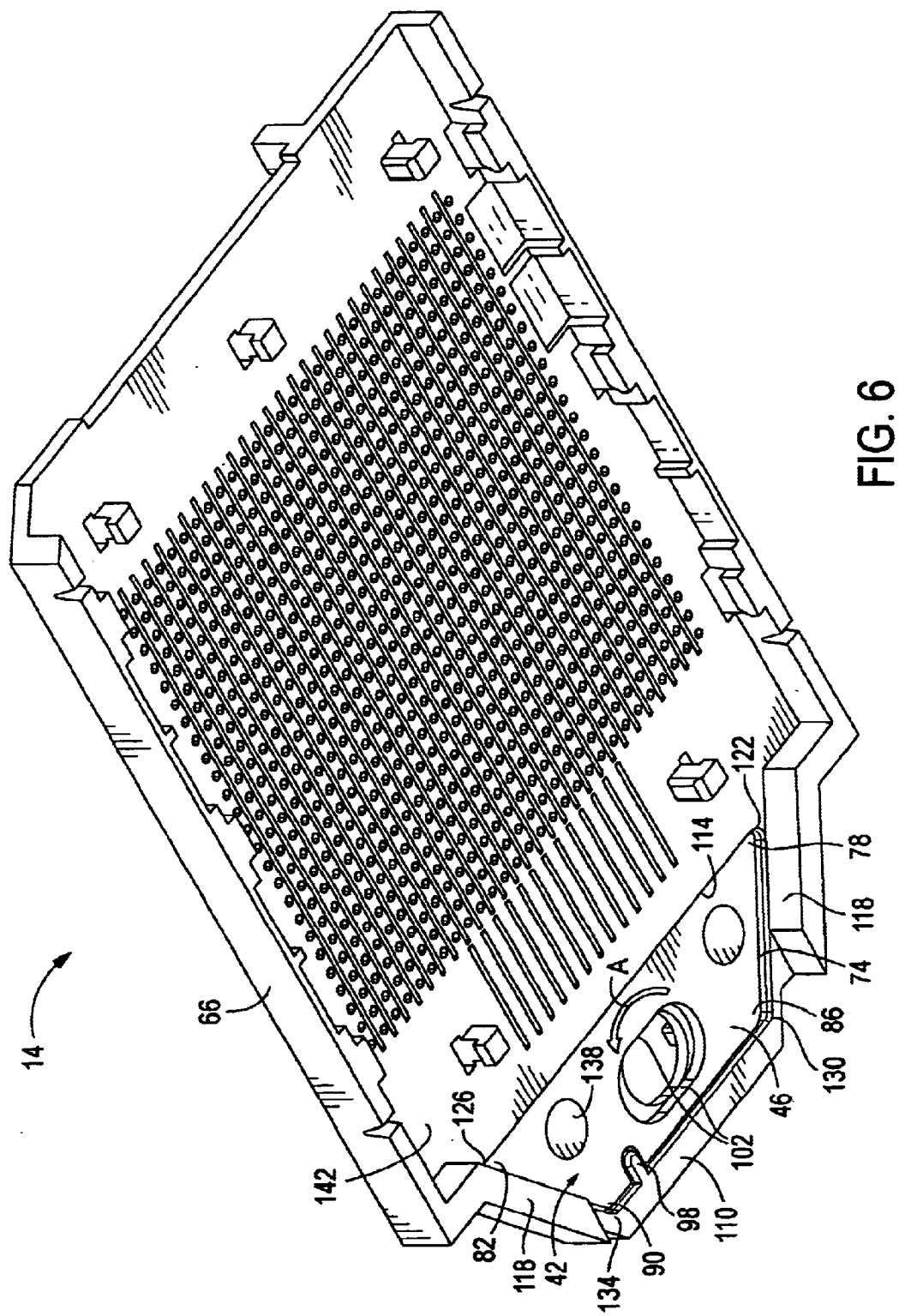
FIG. 6 illustrates a bottom isometric view of a socket cover with the drive plate inserted according to an embodiment of the present invention.

FIG. 6 illustrates a bottom isometric view of the socket cover 14 with the drive plate 46 inserted. During assembly, the drive plate 46 is press fitted into the recessed area 42 such that the keying feature 98 of the recessed area 42 is received in the notch 94 (FIG. 4) of the drive plate 46 and the support posts 138 of the recessed area 42 are received within the post holes 106 (FIG. 4) of the drive plate 46. The support posts 138 and post holes 106 form a close tolerance with one another. The drive plate 46 is flush with a bottom surface 142 of the body 66 of the socket cover 14. The first and second inner corners 78 and 82 of the drive plate 46 are positioned proximate the first and second inner corners 122 and 126, respectively, of the recessed area 42. The first and second outer corners 86 and 90 of the drive plate 46 are positioned proximate the first and second outer corners 130 and 134, respectively, of the recessed area 42.

In operation, the cam shaft 38 (FIG. 3) is rotated within the cam aperture 54 of the drive plate 46 and the upper portion 35 abuts against the segments 102 to apply torque forces against the drive plate 46. The drive plate 46 distributes the torque forces throughout points of contact between the drive plate 46 and the recessed area 42 of the socket cover 14. These points of contact include where the support posts 138 engage the post holes 106 in the drive plate 46 on opposite sides of the cam aperture 54 which prevent the drive plate 46 from sliding or "rotating" within the recessed area 42. For example, if the cam shaft 38 is rotated about the rotational axis 75 (FIG. 1) in the direction of arrow A (FIGS. 1 and 5), the cam shaft 38 induces a rotational force on the drive plate 46 also in the direction of arrow A (FIG. 5) such that the first inner corner 78 of the drive plate 46 is pushed toward the first inner corner 122 of the recessed area 42 and the second outer corner 90 of the drive plate 46 is pushed toward the second outer corner 134 of the recessed area 42. However, the support posts 138 absorb the rotational forces carried by the drive plate 46 and prevent the drive plate 46 from "rotating", which in turn prevents any concentration of force on the first inner and second outer corners 122 and 134 of the recessed area 42. Thus, the support posts 138 engage the drive plate 46 to prevent a concentration of force from being applied to the inner, outer, or side walls 114, 110, and 118 of the recessed area 42 at any one point that would result in strains and cracks in the socket cover 14.

Additionally, the trapezoidal shape of the drive plate 46 and the recessed area 42 prevent large concentrations of force from being applied along the outer wall 110 of the recessed area 42. A small acute angle at the first and second inner corners 78 and 82 of the drive plate 46 and the corresponding first and second inner corners 122 and 126 of the recessed area 42 serve to better distribute forces from the drive plate 46 along the thicker side walls 118 of the recessed area 42 and reduce the distribution of forces along the outer wall 110. For example, decreasing the size of the angle of the first inner corner 78 results in a longer side wall 74 of the drive plate 46 and thus a greater surface area for the side wall 74 of the drive plate 46 to engage the side wall 118 of the recessed area 42. By increasing the surface area of engagement, the forces carried by the drive plate 46 are distributed to the side wall 118 over a greater area such that high concentrations of force are not applied to any particular point along the side wall 118 and less force is applied to the outer wall 110.

In one alternative embodiment, the support posts 138 may be located in different positions within the recessed area 42 and corresponding post holes 106 may be located in different positions in the drive plate 46. For example, the support posts 138 may be located further from each other and closer to the first and second inner corners 122 and 126 and the corresponding post holes 106 located further from each other and closer to the first and second inner corners 78 and 82. Conversely, the support posts 138 may be located closer to each other alongside the cam aperture 50 and the corresponding post holes 106 located closer to each other alongside the cam aperture 54.

In another alternative embodiment, the recessed area 42 may have more than two support posts 138 received in corresponding post holes 106 in the drive plate 46. For example, the recessed area 42 may have four smaller support posts 138 situated about the cam aperture 50. Similarly, the drive plate 46 would have corresponding smaller post holes 106 situated about the cam aperture 54 to receive the support posts 138.

In another alternative embodiment, the recessed area 42 and the corresponding drive plate 46 may have any variety of different shapes and sizes. For example, the recessed area 42 and drive plate 46 could have square, triangular, rounded, rhomboid, hexagonal, star-shaped or any other geometric or amorphous, non-symmetric shapes. Additionally, the recessed area 42 and the drive plate 46 can vary in sizes depending on the additional strength required by the drive plate 46 and the size and number of support posts 138 needed to support the drive plate 46. Different sized and shaped drive plates 46 and recessed areas 42 may be appropriate to limit force concentrations on particular points along the inner, outer and side walls 114, 110, and 118 of the recessed area 42.

In another alternative embodiment, the support posts 138 and the corresponding post holes 106 may be any variety of size and shape. For example, the support posts 138 and post holes 106 may be square, rectangular, triangular, star-shaped, hexagonal, or any other geometric or amorphous, non-symmetric shape. Different sized and shaped support posts 138 may be appropriate for different torque requirements and socket cover 14 uses.

In another alternative embodiment, the support posts 138 extend from the drive plate 46 and the post holes 106 are located in the recessed area 42. Thus, the drive plate 46 is fitted into the recessed area 42 with the support posts 138 extending into the body 66 of the socket cover 14. Such an embodiment may be used where stronger support posts 138 formed of metal or a similarly strong and durable substance are needed to withstand torque forces applied to the drive plate 46.

While the invention has been described with reference to certain embodiments, it will be understood by those skilled in the art that various changes may be made and equivalents may be substituted without departing from the scope of the invention. In addition, many modifications may be made to adapt a particular situation or material to the teachings of the invention without departing from its scope. Therefore, it is intended that the invention not be limited to the particular embodiment disclosed, but that the invention will include all embodiments falling within the scope of the appended claims.

What is claimed is:

1. An electrical socket assembly comprising:
    a socket cover having a longitudinal axis slidably mounted to a socket base, said socket cover including an array of pin holes aligned with and positioned above a corresponding array of receptacle contacts in said socket base;
    said socket cover having a recessed cam retention area containing a drive plate fixedly mounted on posts within said recessed cam retention area; and
    a cam shaft rotatably engaging said socket cover, socket base and drive plate to slide said socket cover with respect to said socket base in a direction parallel to said longitudinal axis.

2. The socket assembly of claim 1, wherein one of said socket cover and said drive plate includes said posts and the other of said socket cover and said drive plate includes post holes formed therein, said posts and post holes engaging one another.

3. The socket assembly of claim 1, wherein one of said socket cover and said drive plate includes said posts and the other of said socket cover and said drive plate includes post holes formed therein, said posts and post holes engaging one another, said posts and post holes positioned on opposite sides of said cam shaft to prevent rotation of said drive plate about said cam shaft.

4. The socket assembly of claim 1, wherein said recessed cam retention area is located on an underside of said socket cover, said recess holding said drive plate.

5. The socket assembly of claim 1, wherein said cam retention area includes a keying feature and said drive plate includes a notch that receives said keying feature to properly align said drive plate with respect to said cam retention area.

6. The socket assembly of claim 1, wherein said drive plate is trapezoidal in shape with acutely angled side walls that engage corresponding side walls surrounding said cam retention area.

7. The socket assembly of claim 1, wherein said drive plate includes an oval cam aperture that receives said cam shaft, said cam aperture being partly defined by parallel side segments that engage said cam shaft to absorb forces created by said cam shaft.

8. The socket assembly of claim 1, wherein said drive plate is planar and is surrounded by edges, said drive plate including post holes remote from said edges.

9. The socket assembly of claim 1, wherein said drive plate has non-load bearing peripheral edges preventing concentration of forces at said edges.

10. An electrical socket cover comprising:
    a body having a longitudinal axis, said body including an array of pin holes and a recessed cam retention area containing a cam shaft and a drive plate fixedly mounted on posts within said recessed cam retention area, said cam shaft including an operating lever formed therewith; and
    said cam shaft rotatably engaging said body and said drive plate to move said body in a direction parallel to said longitudinal axis.

11. The socket cover of claim 10, wherein one of said body and said drive plate includes said posts and the other of said body and said drive plate includes post holes, said posts and post holes engaging one another.

12. The socket cover of claim 10, wherein said socket cover is slidably mounted to a socket base.

13. The socket cover of claim 10, wherein said drive plate includes post holes formed therein, said posts and post holes positioned on opposite sides of said cam shaft such that said posts and said post holes engage one another to prevent rotation of said drive plate about said cam shaft.

14. The socket cover of claim 10, wherein said recessed cam retention area is located on an underside of said socket cover, said recess holding said drive plate.

15. The socket cover of claim 10, wherein said cam retention area includes a keying feature and said drive plate includes a notch that receives said keying feature to properly align said drive plate with respect to said cam retention area.

16. The socket cover of claim 10, wherein said drive plate is trapezoidal in shape with acutely angled side walls that engage corresponding side walls surrounding said cam retention area.

17. The socket cover of claim 10, wherein said drive plate includes an oval cam aperture that receives said cam shaft, said cam aperture being partly defined by parallel side segments that engage said cam lever to absorb forces created by said cam shaft.

18. The socket cover of claim 10, wherein said drive plate is planar and is surrounded by edges, said drive plate including post holes remote from said edges.

19. The socket cover of claim 10, wherein said drive plate has non-load bearing peripheral edges preventing concentration of forces at said edges.

20. An electrical socket assembly comprising:
   a socket cover having a longitudinal axis slidably mounted to a socket base, said socket cover including an array of pin holes aligned with and positioned above a corresponding array of receptacle contacts in said socket base;
   said socket cover having a recessed cam retention area containing a drive plate mounted on posts therein; and
   a cam shaft received in said cam retention area and engaging said socket cover and said socket base, said cam shaft comprising an upper portion and a lower portion, said upper portion having a radius larger than a radius of said lower portion, said upper and lower portions sharing a common wall at a point in their respective perimeters, said upper and lower portions rotating about a common axis of rotation as said cam shaft is operated to move said socket cover relative to said socket base in a direction parallel to said longitudinal axis.

* * * * *